United States Patent [19]

Clough et al.

[11] 4,382,831

[45] May 10, 1983

[54] METALLIZATION OF SUPPORT MEMBERS

[75] Inventors: Philip J. Clough, Gorham, Me.; Roswell E. Hubbard, Wayland, Mass.; John F. McDermott, Framingham, Mass.; Richard G. Miekka, Sudbury, Mass.

[73] Assignee: Dennison Manufacturing Company, Framingham, Mass.

[21] Appl. No.: 313,526

[22] Filed: Oct. 21, 1981

[51] Int. Cl.³ .................. B32B 35/00; B44C 1/14; B44C 3/02
[52] U.S. Cl. .................. 156/94; 156/233; 156/235; 156/249; 156/272.6; 156/275.5; 156/275.7; 156/344; 427/142; 427/147; 427/148; 428/209; 428/344; 428/913; 428/914
[58] Field of Search .......... 101/327; 156/233, 234, 156/238–241, 94, 98, 230, 235, 249, 272.2, 272.6, 273.7, 275.5, 275.7, 324, 344; 427/147–149, 208, 209, 140, 142; 428/200, 209, 211, 344, 346–350, 352–355, 464, 537, 913, 914, 458, 461

[56] References Cited

U.S. PATENT DOCUMENTS 3,235,395  2/1966  Scharf .................. 156/233

FOREIGN PATENT DOCUMENTS 48-29976  10/1973  Japan .................. 156/233
722409  1/1955  United Kingdom .................. 156/233

Primary Examiner—Bruce H. Hess
Attorney, Agent, or Firm—George E. Kersey; Arthur B. Moore; Barry D. Josephs

[57] ABSTRACT

Method and apparatus for the metallization of support members, such as paper sheeting and other cellulosic products. A metallic film is transferred to the paper support from a plastic sheet carrier and adhered to the paper by a thermoplastic material. The carrier, typically of stabilized plastic with an adhered film of metal and an overlay of thermoplastic adhesive with the paper support. Pressure and/or heat is applied to the composite which is subsequently cooled and the carrier stripped away to leave the desired metallic layer on the receiving surface of the paper support.

This transfer procedure overcomes the objections associated with metal foil laminates and is particularly suitable for metallizing support members, like paper, which are difficult to metallize directly because they release significant amounts of vapor during conventional vacuum metallization. The results are also superior to those realized using an adhesive with dispersed metal particles, and the need for curing of the adhesive is eliminated.

20 Claims, 4 Drawing Figures

METALLIZATION OF SUPPORT MEMBERS

BACKGROUND OF THE INVENTION

This invention relates to the metallization of support members and, more particularly, to the metallization of cellulosic support members such as paper.

Metallization is a process in which a metallic material, such as aluminum, is applied to an underlying support member. This can be done by bonding a thin film of metallic foil to the surface of the support member. The bonding takes place using a suitable adhesive and the resulting product is a laminate of the support material and the foil.

Alternatively, metal is vaporized in a high vacuum using resistance, induction or an electron beam and forms a metallic layer on a support member. This procedure is suitable only for support members that do not contain significant amounts of moisture. When moisture is present, the vacuum draws vapors and other by-products which must be eliminated before subsequent metallizing can take place. Irregularities in the support surface also appear in the final product.

As a result, where it is desired to employ a vacuum for the direct metallization of a paper support member, the paper is first dried to a level where there will be negligible outgassing. This procedure, however, makes the support material brittle and difficult to process. Additionally, once the vacuum metallization of the dried paper is completed, it is necessary to restore its moisture level to near its original value. This is a time consuming and costly procedure that requires the use of appreciable amounts of energy for drying.

Accordingly it is an object of the invention to facilitate the metallization of support members, particularly cellulosic products such as paper. A related object is to facilitate the metallization of support members with irregular surfaces. Another related object is to achieve suitable metallization of support members that exhibit outgassing when subjected to a vacuum.

Another object of the invention is to achieve suitable smoothness and reflectivity for metallized support surfaces.

Still another object of the invention is to achieve efficient and high speed metallization of support members.

Still other objects of the invention are to overcome the disadvantages associated with metallization by foil lamination and metallization by vacuum.

One attempt to overcome the foregoing difficulties involves the application of an adhesive with dispersed metallic powder to a support surface. This procedure requires that the metallic laden adhesive be allowed to cure on the support surface. Curing requires that the product be aged for a considerable period of time. The result is a reduction in the efficiency and speed with which the desired metallized product can be produced. Furthermore, metallic powder creates environmental dust objections. There can be the further objection that surface irregularities in the support member are not completely compensated. Finally the dispersion of metallic powder in an adhesive prevents the realization of a continuous metallic film and is accompanied by an inevitable reduction in the reflectivity of the metallized surface. Much of the metal is deposited at an internal level of the adhesive where it is ineffective in the desired reflectance of light.

Accordingly it is still another object of the invention to achieve suitable metallization of support members having irregular surfaces without the disadvantages associated with the prior art use of metallic powders.

Another object is to achieve the desired metallization without requiring that metallic powder be dispersed in an adhesive which must be allowed to cure.

Still another object of the invention is to increase the efficiency of metallization over and above that which can be achieved by a process which requires curing.

A further object of the invention is to increase the efficiency with which the metal used in metallization contributes to the reflectivity of light from a metallized surface. A related object is to avoid the loss of reflectivity by metallic elements such as powder which becomes embedded below the surface where the reflectivity takes place.

SUMMARY OF THE INVENTION

In accomplishing the foregoing and related objects, the invention provides a metallization method in which a support member, such as paper sheeting, receives a metallic film from a plastic sheet carrier. The metallic film carries a water-based thermoplastic adhesive material, and becomes adhered to the paper support thereby. The thermoplastic material serves to compensate for any irregularities in the support surface, and the transferred metallic film is provided with a suitable degree of smoothness by virtue of its contact with a smooth mating surface of the plastic carrier.

In accordance with one aspect of the invention the water-based thermoplastic adhesive layer is applied to the composite of the support member and the metallized plastic carrier. The thermoplastic layer in the composite is then caused to flow, by, for example, being subjected to pressure and/or heat. The pressure and/or heating effect is sufficient to produce flow in the thermoplastic layer short of melting. The composite is thereafter cooled and the plastic sheet stripped away to leave the support member with the metallic film adhered to it by the thermoplastic layer.

In accordance with another aspect of the invention, the plastic sheet is remetallized and used in the subsequent metallization of other support members. The number of reuses is governed by the thickness of the plastic sheet, with a reuse permitted for each 0.1 mil thickness of the sheet.

In accordance with still another aspect of the invention the support member is a sheet of cellulosic material which is prepared from either mechanical or chemical pulp. The cellulosic sheet desirably is size-press coated on at least the receiving surface for metallization with a water dispersion of clay and resin. The resin is advantageously aqueous styrene butadiene.

In accordance with a further aspect of the invention the thermoplastic adhesive layer is selected from the class consisting of styrenes, styrene-polyolefin mixtures, polyamides, nitro-styrenes, vinyl acetate and copolymers including ethylene vinyl acetate, vinyl chlorides and plasticized nitrocelluloses. A particularly suitable thermoplastic layer is a mixture of styrene and vinyl resins being, for example, 80 parts styrene butadiene and 20 parts vinyl acetate, or 80 parts styrene and 20 parts ethylene vinyl acetate.

In accordance with yet another aspect of the invention the thermoplastic material that serves as the adhesive includes a viscosity modifier selected from the class consisting of amine esters, sulphated oils, colloidal silicas, polyoxyalkylene fatty acid esters, starches, carboxylated cross-linked acrylic emulsions, methyl vinyl ether maleic anhydrides and carboxylated methyl celluloses. One part of the viscosity modifier is desirably included with each 100 parts of thermoplastics. The viscosity modified thermoplastic is prepared as a coating emulsion that desirably ranges between 20 and 60 percent solids and is advantageously 38 percent solids.

In accordance with a still further aspect of the invention the thermoplastic is rendered flowable by being subjected to pressure at the nip of two rollers which provide a force in the range from about 200 to 1000 pounds per linear inch, preferably 600 pounds per linear inch.

In accordance with a yet further aspect of the invention the metallizable member is a support with a thermoplastic layer, and the transfer member is a plastic sheet with a metallic layer. The plastic sheet is selected from the classes of olefins and polyesters. A particularly suitable olefin is biaxially oriented polypropylene. In the case of polyesters the metallic layer is releasably adhered thereto by a material such as wax.

In accordance with still another aspect the invention can be used for the metallization of support members in the form of paper board having a basis weight in the range from 100 to 400 grams per square meter. This kind of metallization cannot be accomplished by conventional techniques.

DESCRIPTION OF THE DRAWINGS

Other aspects of the invention will become apparent after considering several illustrative embodiments, taken in conjunction with the drawings in which.

DETAILED DESCRIPTION

Figure 1:
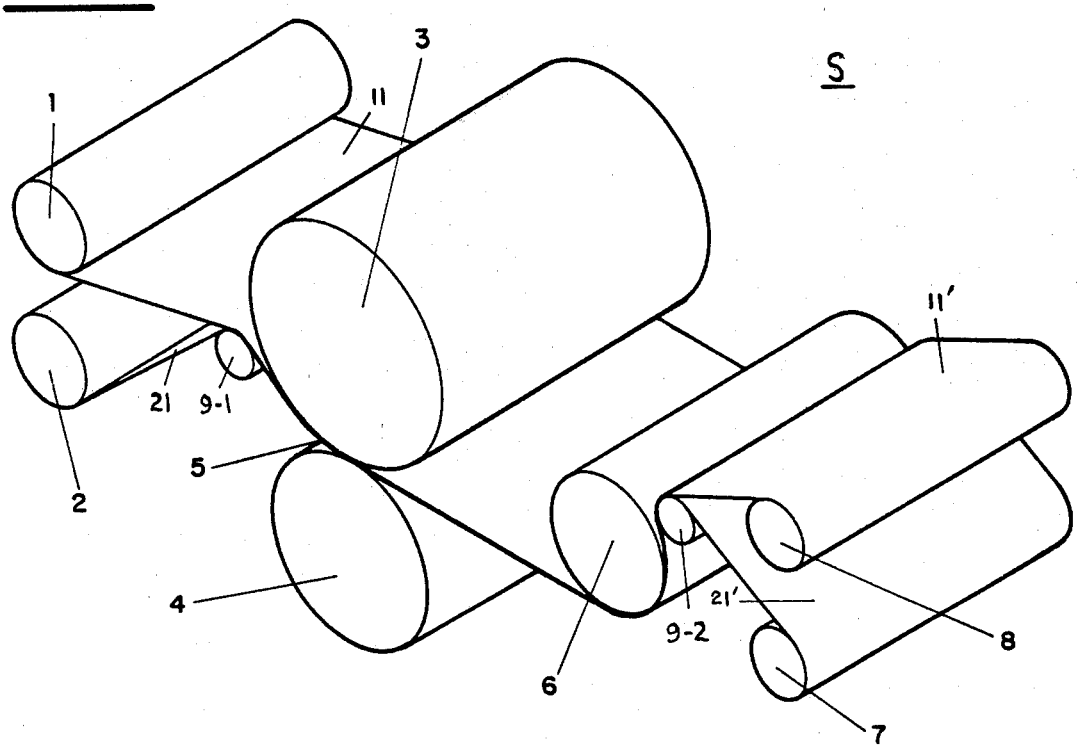
FIG. 1 is a fragmentary perspective view of a metallization system in accordance with the invention.

With reference to the drawings, a metallization system S in accordance with the invention is shown in fragmentary outline in FIG. 1. The system S makes use of two supply rolls 1 and 2, a heated drum 3, a contacting resilient drum 4, a water cooled drum 6 and rewind rolls 7 and 8.

The supply roll 1 carries a wound carrier sheet 11 of a metallized plastic sheet. The metallic side of the sheet 11 carries a thermoplastic coating and faces a receiving or support sheet 21 that is supplied from the lower supply drum 2.

Figure 2:
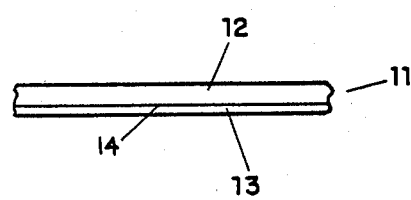
FIG. 2 is a portion of a metallized plastic carrier for use in the system of FIG. 1.

The specific structure of the carrier sheet 11 on the supply drum 1 is shown in detail in FIG. 2. Similarly, the specific structure of the coated receiving sheet 21 is shown in detail in FIG. 3.

The metallized carrier 11 on the upper supply drum 1 is unrolled and extended over an intervening idler roll 9-1 to the lower surface of the heated drum 3.

The receiving or support sheet 21 from the lower supply drum 2 also extends to the intervening idler roll 9-1 where it makes contact with the thermoplastic surface of the carrier 11. The two sheets 11 and 21 then extend in contact with one another to the heated drum 3 where pressure is applied by the resilient drum 4 at a nip 5. The drum 4 can be of any suitable construction as long as its surface provides suitable resiliency. The composite of the carrier 11 and the support 21 extends from the nip 5 to the lower surface of the water cooled drum 6. The purpose of the drum 6 is to lower the temperature of the composite to a suitable level before separation of the two sheets 11 and 21 which takes place at the upper surface of a second idler roll 9-2.

The separated sheets are wound on respective takeup rolls 7 and 8 with the sheet 11' on the upper roll 8 being devoid of its metallic layer which has been transferred to the metallized sheet 21' that is wound on the lower roll 7. The resulting metallized sheeting 21' is subsequently removed with the lower roll 7.

It will be understood that the various rolls 1, 2, 9-1, 9-2, 7 and 8 are supported in conventional fashion. The various rolls are also of a diameter that is appropriate for the stock being processed. As the basis weight of the stock increases, the diameters of the associated rolls are increased correspondingly. In addition, heating of the drum 3 and water cooling of the drum 6 are accomplished conventionally. Heating of the drum 3 is unnecessary when the pressure between the drums 3 and 4 is sufficient to render the thermoplastic flowable. The combination of heat and pressure, however, is desirable to accentuate this result.

Figure 3:
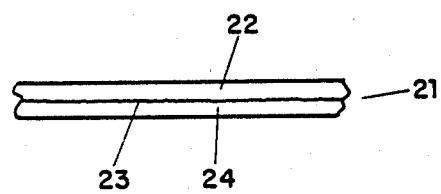
FIG. 3 is a fragmentary sectional view of a thermoplastic coated receiver or support sheet for use in the system of FIG. 1.

As can be seen from the detailed fragment in FIG. 2, the metallized plastic carrier 11 includes a plastic substrate 12, a metallic coating 13, and a thermoplastic layer 14. Similar details for the receiver support 21 are shown in FIG. 3. The coated paper sheet 21 is constituted by a base paper layer 22, a size press coating 24, and a bonding layer 23 between the coating 24 and the base paper 22. It is to be noted that the thermoplastic layer 14 faces the coating 24 of the sheet 11 in FIG. 1.

Figure 4:
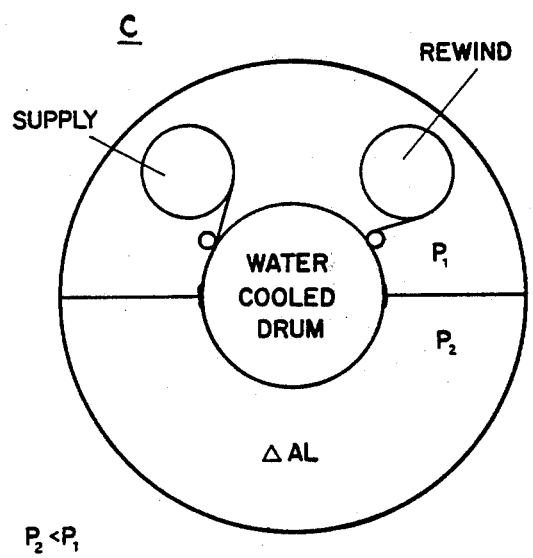
FIG. 4 is a schematic view of a two-zone direct metallization chamber for preparing the metallized plastic carrier of FIG. 2.

Metallization of the plastic substrate 12 of the composite 11 in FIG. 2 can be achieved in a chamber C as illustrated in FIG. 4. A supply drum wound with a plastic sheet 12 has its sheet extended over an idler roll $I_2$ around the periphery of a water cooled drum, and then about a second idler roll $I_2$ to a rewind drum. The chamber "C" is divided into two zones the first zone, which is semicylindrical, is at a pressure $P_1$ and the remaining semicylindrical zone is at a pressure $P_2$, where the pressure $P_2$ is lower than pressure $P_1$. Consequently, conventional seals $S_1$ and $S_2$ are used to retain the pressure differential between the two portions of the chamber C where the sheet 12 from the supply drum enters and then leaves as metallized sheet 11. In the metallizing portion, metal for example aluminum is vaporized as represented by the symbol $\Delta$ AL and allowed to accumulate on the plastic sheet 12 as the layer 13.

The invention is further illustrated with reference to the following illustrative examples which are to be taken as nonlimiting.

EXAMPLE I

Ground wood (mechanical pulp) paper sheeting of standard basis weight is size-press coated in conventional fashion. The coated paper sheeting is then provided with a thermoplastic layer having a weight of 4 grams per square meter.

Plastic sheeting that has a metallic layer with a thickness of about 200 angstroms has its metallic surface brought into contact with the thermoplastic layer of the paper sheeting and subjected to pressure and heat to render the thermoplastic flowable.

The composite of the thermoplastic layer, the paper sheeting and the metallized plastic sheeting is then cooled and the plastic sheeting peeled away, transferring the metallic layer to the paper sheeting by virtue of the adhesive effect of the thermoplastic layer.

The result is a metallized sheet of paper with a high and acceptable degree of reflectivity, with the metallic layer stripped away from the plastic sheeting, which is reusable.

EXAMPLE II

Example I is repeated with the plastic sheeting remetallized and used to transfer a metallic layer to a different paper carrier for each remetallization.

The result in each case is a metallized paper sheet with a high and acceptable degree of reflectivity.

EXAMPLE III

Example II is repeated according to the thickness of the plastic sheeting, with one reuse per 0.1 mil thickness of the sheeting, so that, a 0.5 mil thickness permitted five reuses and a 0.9 mil thickness permitted nine reuses. In each case the metallized paper exhibits suitable reflectivity.

EXAMPLE IV

The preceeding examples are repeated using ground wood paper sheeting having a basis weight in the range from about 40 to 60 grams per square meter, and preferably about 50 grams per square meter. The results are substantially the same as for Example I.

EXAMPLE V

The preceding examples are repeated using paper board having a basis weight in the range from about 100 to 400 grams per square meter. The results are substantially the same as for Example I.

EXAMPLE VI

The preceding examples are repeated using a size press coating on at least one side with a water dispersion of clay and resin. The results are substantially the same as for Example I.

EXAMPLE VII

The preceding examples are repeated using a size press coating in which the resin is aqueous styrene butadiene. The results are substantially the same as for Example I.

EXAMPLE VIII

The preceding examples are repeated in which the thermoplastic layer is plastic provided by a mixture of styrene and vinyl resins. The results are substantially the same as for Example I.

EXAMPLE IX

Example VII is repeated using a water based thermoplastic layer of 80 parts styrene butadiene, for example Dow No. 620, with 20 parts vinyl acetate, for example Borden No. 2142. The results are substantially the same as in Example I.

EXAMPLE X

The preceding examples are repeated with a viscosity modifier added to the thermoplastic layer. The results are an improvement over those of Example I.

EXAMPLE XI

Example X is repeated using a viscosity modifier selected from the class consisting of amine esters, for example "NAPCO" DC 133 of the Napco Chemical Co.; sulphated oils, for example "NAPCO CUSTER" of the Napco Chemical Co.; colliodal silicas, for example "CAB-O-SIL" of Cabot Corp.; polyoxyalkylene fatty acid esters, for example "NONISOL 300" of the Ciba-Geigy Chemical Company; starches, for example "NUFILM H" of the National Starch and Chemical Corp.; carboxylated cross-linked acrylic emulsions, for example "ACRYSOL ASE 60" of the Rohm & Haas Co.; methyl vinyl ether maleic anhydrides, for example "GANTREZ AN-119" of the GAF Corp. Chemical Products; and carboxy methyl celluloses, for example "NATROSOL 7M, 7L or 7H" of Hercules, Inc.

EXAMPLE XII

The preceding examples are repeated with the thermoplastic layer being provided by a coating emulsion in water of ethylene vinyl acetate and styrene.

EXAMPLE XIII

The preceding examples are repeated with the coated paper sheeting and thermoplastic layer dried to a moisture content in the range from about 2–13 percent, with 6 percent being preferred.

EXAMPLE XIV

The preceding examples are repeated with the plastic sheeting selected from the class of olefins, including in particular polypropylene which has at least a uniaxial orientation, and preferably a biaxial orientation, for example Hercules biaxial polypropylene film sold under the trademark and trade name "B-503 BOP".

EXAMPLE XV

The preceding examples are repeated with the paper and the plastic sheeting being advanced during processing at a speed ranging between 200 and 1000 fpm with a speed of 600 fpm being preferred.

EXAMPLE XVI

The preceding examples are repeated with the composite of the coated paper sheeting and the metallized plastic sheeting being cooled to about room temperature by a water cooled drum.

EXAMPLE XVII

The preceding examples are repeated with chemical pulp paper, achieving the same degree of reflectivity as Example I with less metal.

EXAMPLE XVIII

The preceding examples are repeated with a plastic sheeting of polyester which is provided with a release coating before metallization.

EXAMPLE XIX

Example I is repeated with the plastic sheeting being subjected to corona treatment before metallization.

EXAMPLE XX

The preceding examples are repeated with a metallic thickness in the range from about 100 to 500 angstroms.

EXAMPLE XXI

The preceding examples are repeated with a metallic thickness having a resistance in the range from about ½ ohm per square to about 5 ohms per square, with 2 ohms per square being preferred.

EXAMPLE XXII

The preceding examples are repeated with the thermoplastic layer being selected from the class consisting of styrenes, styrene-polyolefin mixtures, acrylics, polyamides, nitrostyrenes, vinyl acetates and copolymers including ethylene vinyl acetate, vinyl chlorides, and plasticized nitrocelluloses or mixtures.

EXAMPLE XXIII

The preceding examples are repeated with the preliminary coating of the paper sheeting being made uniformly on opposed surfaces.

EXAMPLE XXIV

The preceding examples are repeated with the composite of the coated paper sheeting and the metallized plastic sheeting being heated in the range from about 230° F. to about 275° F., with 255° F. being preferred.

EXAMPLE XXV

The preceding examples are repeated with a force applied at the nip of two contacting rollers in the range from about 400 to about 1000 pounds per linear inch, with a force of 600 pounds per linear inch being preferred.

While various aspects of the invention have been set forth by the drawings and the specification, it is to be understood that the foregoing detailed description is for illustration only and that various changes in parts, as well as the substitution of equivalent constituents for those shown and described, may be made without departing from the spirit and scope of the invention as set forth in the appended claims.

We claim:

1. The method of metallizing a support member which comprises the steps of:
   (1) providing a support member;
   (2) providing a metallized plastic sheet with a thermoplastic layer comprising a water-based adhesive thereon;
   (3) forming a composite of the support member and the metallized sheet, with said thermoplastic layer therebetween;
   (4) rendering said thermoplastic layer flowable; and
   (5) rendering said thermoplastic layer nonflowable in said composite and stripping said plastic sheet therefrom to leave said support member with said metallic layer adhered thereto by said thermoplastic layer.

2. The method of claim 1 wherein said plastic sheet is remetallized and reused for the metallization of other support members.

3. The method of claim 2 wherein the number of reuses of said plastic sheet is proportioned to the thickness thereof.

4. The method of claim 3 wherein a reuse of said plastic sheet is permitted for each 0.1 mil thickness thereof.

5. The method of claim 1 wherein said support member is a sheet of cellulosic material.

6. The method of claim 5 wherein said cellulosic material is prepared from mechanical or chemical pulp.

7. The method of claim 6 wherein said paper sheet is size-press coated on at least one side with a water dispersion of clay and resin.

8. The method of claim 7 wherein said resin is an aqueous dispersion of styrene butadiene.

9. The method of claim 1 wherein said thermoplastic layer is selected from the class consisting of styrenes, styrene polyolefin mixtures, polyamides, nitrostyrenes, vinyl acetates and copolymers including ethylene vinyl acetate, vinyl chlorides, acrylics, plasticized nitrocelluloses and mixtures of the foregoing.

10. The method of claim 9 wherein said thermoplastic layer is a mixture of styrene and vinyl resins.

11. The method of claim 10 wherein the styrene resin is 80 parts styrene butadiene and the vinyl resin is 20 parts vinyl acetate.

12. The method of claim 10 wherein said vinyl resin is ethylene vinyl acetate.

13. The method of claim 9 wherein said thermoplastic layer further includes a viscosity modifier selected from the class consisting of amine esters, sulphated oils, colliodal silicas, polyoxyalkylene fatty acid esters, starches, carboxylated cross-linked acrylic emulsions; methyl vinyl ether maleic anhydrides, and carboxylated methyl celluloses.

14. The method of claim 13 wherein said viscosity modifier comprises one part carboxylated cross-linked acrylic emulsion.

15. The method of claim 1 wherein said plastic sheeting is selected from the class of olefins and polyesters.

16. The method of claim 15 wherein said polyester is release coated.

17. The method of claim 15 wherein said olefin is polypropylene with at least one axial degree of orientation.

18. The method of claim 15 wherein said plastic sheet has a preliminary corona treatment.

19. The method of claim 1 wherein said composite is heated in the range from about 230° F. to about 275° F., and preferably about 255° F.

20. The method of claim 1 wherein said composite is subjected to force in the range from about 400 to about 1000 pounds per linear inch, preferably about 600 pounds per linear inch.

* * * * *